(12) United States Patent
Tajalli (10) Patent No.: US 10,965,290 B2
(45) Date of Patent: Mar. 30, 2021

(54) PHASE ROTATION CIRCUIT FOR EYE SCOPE MEASUREMENTS

(71) Applicant: Kandou Labs, S.A., Lausanne (CH)

(72) Inventor: Armin Tajalli, Salt Lake City, UT (US)

(73) Assignee: KANDOU LABS, S.A., Lausanne (CH)

( * ) Notice: Subject to any disclaimer, the term of this patent is extended or adjusted under 35 U.S.C. 154(b) by 0 days.

(21) Appl. No.: 16/399,946

(22) Filed: Apr. 30, 2019

(65) Prior Publication Data

US 2019/0260381 A1    Aug. 22, 2019

Related U.S. Application Data

(63) Continuation of application No. 15/603,404, filed on May 23, 2017, now Pat. No. 10,277,431.

(Continued)

(51) Int. Cl.
| | |
|---|---|
| *H03L 7/08* | (2006.01) |
| *H03L 7/087* | (2006.01) |
| *H03L 7/099* | (2006.01) |
| *H04L 7/033* | (2006.01) |
| *H04L 25/14* | (2006.01) |
| *H04L 25/02* | (2006.01) |
| *H04L 25/40* | (2006.01) |

(Continued)

(52) U.S. Cl.
CPC .......... *H03L 7/0807* (2013.01); *H03K 19/21* (2013.01); *H03L 7/087* (2013.01); *H03L 7/0891* (2013.01); *H03L 7/0995* (2013.01); *H03L 7/0998* (2013.01); *H04L 7/0337* (2013.01); *H04L 25/0272* (2013.01); *H04L 25/14* (2013.01); *H04L 25/40* (2013.01); *H04L 25/493* (2013.01); *H03L 2207/06* (2013.01); *H04L 7/0025* (2013.01); *H04L 2203/02* (2013.01)

(58) Field of Classification Search
CPC ... H03L 2207/06; H03L 7/0807; H03L 7/087; H04L 7/0337; H04L 7/0025; H04L 25/40
USPC .......................................................... 375/354
See application file for complete search history.

(56) References Cited

U.S. PATENT DOCUMENTS

| | | |
|---|---|---|
| 4,414,512 A | 11/1983 | Nelson |
| 4,839,907 A | 6/1989 | Saneski |

(Continued)

FOREIGN PATENT DOCUMENTS

| | | |
|---|---|---|
| CN | 203675093 U | 6/2014 |
| EP | 0740423 A2 | 10/1996 |

OTHER PUBLICATIONS

Riley, M. W., et al., "Cell Broadband Engine Processor: Design and Implementation", IBM Journal of Research and Development, vol. 51, No. 5, Sep. 2007, 545-557 (13 pages).

(Continued)

*Primary Examiner* — Leila Malek
(74) *Attorney, Agent, or Firm* — Invention Mine LLC (57) ABSTRACT

Methods and systems are described for generating, with a local oscillator and an adjustable phase interpolator, a data-sampling clock and a variable-phase-offset eye-measurement clock, forming a received data signal using a multi-input comparator, generating, using a data slicer and the data sampling clock, a receive sample of the received data signal, and generating, using at least one eye slicer and the variable-phase-offset eye-measurement clock, a plurality of eye characteristic measurements by adjusting a sampling threshold of the at least one eye slicer and a phase offset of the variable-phase-offset eye-measurement clock.

20 Claims, 10 Drawing Sheets

Related U.S. Application Data (60) Provisional application No. 62/395,993, filed on Sep. 16, 2016.

(51) Int. Cl.
*H04L 25/493* (2006.01)
*H03K 19/21* (2006.01)
*H03L 7/089* (2006.01)
*H04L 7/00* (2006.01)

(56) References Cited

U.S. PATENT DOCUMENTS

| | | |
|---|---|---|
| 5,266,907 A | 11/1993 | Dacus |
| 5,528,198 A | 6/1996 | Baba et al. |
| 5,602,884 A | 2/1997 | Wieczorkiewicz et al. |
| 5,629,651 A | 5/1997 | Mizuno |
| 5,802,356 A | 9/1998 | Gaskins et al. |
| 6,026,134 A | 2/2000 | Duffy et al. |
| 6,122,336 A | 9/2000 | Anderson |
| 6,307,906 B1 | 10/2001 | Tanji et al. |
| 6,316,987 B1 | 11/2001 | Dally et al. |
| 6,380,783 B1 | 4/2002 | Chao et al. |
| 6,389,091 B1 | 5/2002 | Yamaguchi et al. |
| 6,509,773 B2 | 1/2003 | Buchwald et al. |
| 6,717,478 B1 | 4/2004 | Kim et al. |
| 6,838,951 B1 | 1/2005 | Nieri et al. |
| 7,078,978 B2 | 7/2006 | Wakii |
| 7,102,449 B1 | 9/2006 | Mohan |
| 7,199,728 B2 | 4/2007 | Dally et al. |
| 7,336,112 B1 | 2/2008 | Sha et al. |
| 7,532,697 B1 | 5/2009 | Sidiropoulos et al. |
| 7,535,957 B2 | 5/2009 | Ozawa et al. |
| 7,616,075 B2 | 11/2009 | Kushiyama |
| 7,650,525 B1 | 1/2010 | Chang et al. |
| 7,688,929 B2 | 3/2010 | Co |
| 7,839,229 B2 | 11/2010 | Nakamura et al. |
| 7,860,190 B2 | 12/2010 | Feller |
| 8,036,300 B2 | 10/2011 | Evans et al. |
| 8,074,126 B1 | 12/2011 | Qian et al. |
| 8,253,454 B2 | 8/2012 | Lin |
| 8,744,012 B1 | 6/2014 | Ding et al. |
| 8,791,735 B1 | 7/2014 | Shibasaki |
| 8,929,496 B2 | 1/2015 | Lee et al. |
| 9,036,764 B1 | 5/2015 | Hossain et al. |
| 9,059,816 B1 | 6/2015 | Simpson et al. |
| 9,306,621 B2 | 4/2016 | Zhang et al. |
| 9,374,250 B1 | 6/2016 | Musah et al. |
| 9,397,868 B1 | 7/2016 | Hossain et al. |
| 9,438,409 B1 | 9/2016 | Liao et al. |
| 9,520,883 B2 | 12/2016 | Shibasaki |
| 9,565,036 B2 | 2/2017 | Zerbe et al. |
| 9,577,815 B1 | 2/2017 | Simpson et al. |
| 9,602,111 B1 | 3/2017 | Shen et al. |
| 9,906,358 B1 | 2/2018 | Tajalli |
| 9,960,902 B1 | 5/2018 | Lin et al. |
| 10,055,372 B2 | 8/2018 | Shokrollahi |
| 2003/0001557 A1 | 1/2003 | Pisipaty |
| 2003/0146783 A1 | 8/2003 | Bandy et al. |
| 2004/0092240 A1 | 5/2004 | Hayashi |
| 2005/0024117 A1 | 2/2005 | Kubo et al. |
| 2005/0084050 A1 | 4/2005 | Cheung et al. |
| 2005/0117404 A1 | 6/2005 | Savoj |
| 2005/0128018 A1 | 6/2005 | Meltzer |
| 2005/0201491 A1 | 9/2005 | Wei |
| 2005/0220182 A1 | 10/2005 | Kuwata |
| 2005/0275470 A1 | 12/2005 | Choi |
| 2006/0140324 A1 | 6/2006 | Casper et al. |
| 2006/0232461 A1 | 10/2006 | Felder |
| 2006/0233291 A1 | 10/2006 | Garlepp et al. |
| 2007/0001713 A1 | 1/2007 | Lin |
| 2007/0001723 A1 | 1/2007 | Lin |
| 2007/0047689 A1 | 3/2007 | Menolfi et al. |
| 2007/0146088 A1 | 6/2007 | Arai et al. |
| 2007/0147559 A1 | 6/2007 | Lapointe |
| 2007/0183552 A1 | 8/2007 | Sanders et al. |
| 2007/0201597 A1 | 8/2007 | He et al. |
| 2008/0007367 A1 | 1/2008 | Kim |
| 2008/0111634 A1 | 5/2008 | Min |
| 2008/0165841 A1 | 7/2008 | Wall et al. |
| 2008/0181289 A1 | 7/2008 | Moll |
| 2008/0317188 A1 | 12/2008 | Staszewski et al. |
| 2009/0103675 A1 | 4/2009 | Yousefi et al. |
| 2009/0167389 A1 | 7/2009 | Reis |
| 2009/0195281 A1 | 8/2009 | Tamura et al. |
| 2009/0231006 A1 | 9/2009 | Jang et al. |
| 2009/0262876 A1 | 10/2009 | Arima et al. |
| 2009/0262877 A1 | 10/2009 | Shi et al. |
| 2010/0033259 A1 | 2/2010 | Miyashita |
| 2010/0090723 A1 | 4/2010 | Nedovic et al. |
| 2010/0156543 A1 | 6/2010 | Dubey |
| 2010/0180143 A1 | 7/2010 | Ware et al. |
| 2010/0220828 A1 | 9/2010 | Fuller et al. |
| 2010/0329322 A1 | 12/2010 | Mobin et al. |
| 2010/0329325 A1 | 12/2010 | Mobin et al. |
| 2011/0002181 A1 | 1/2011 | Wang et al. |
| 2011/0025392 A1 | 2/2011 | Wu et al. |
| 2011/0311008 A1 | 12/2011 | Slezak et al. |
| 2012/0200364 A1 | 8/2012 | Iizuka et al. |
| 2012/0206177 A1 | 8/2012 | Colinet et al. |
| 2012/0235717 A1 | 9/2012 | Hirai et al. |
| 2012/0327993 A1 | 12/2012 | Palmer |
| 2013/0088274 A1 | 4/2013 | Gu |
| 2013/0091392 A1 | 4/2013 | Valliappan et al. |
| 2013/0093471 A1 | 4/2013 | Cho et al. |
| 2013/0107997 A1 | 5/2013 | Chen |
| 2013/0108001 A1 | 5/2013 | Chang et al. |
| 2013/0207706 A1 | 8/2013 | Yanagisawa |
| 2013/0243127 A1 | 9/2013 | Ito et al. |
| 2013/0271194 A1 | 10/2013 | Madoglio et al. |
| 2013/0285720 A1 | 10/2013 | Jibry |
| 2013/0314142 A1 | 11/2013 | Tamura et al. |
| 2014/0286381 A1 | 9/2014 | Shibasaki |
| 2015/0078495 A1 | 3/2015 | Hossain et al. |
| 2015/0117579 A1 | 4/2015 | Shibasaki |
| 2015/0180642 A1 | 6/2015 | Hsieh et al. |
| 2015/0220472 A1 | 8/2015 | Sengoku |
| 2015/0222458 A1 | 8/2015 | Hormati et al. |
| 2015/0256326 A1 | 9/2015 | Simpson et al. |
| 2016/0056980 A1 | 2/2016 | Wang et al. |
| 2016/0134267 A1 | 5/2016 | Adachi |
| 2017/0228215 A1 | 8/2017 | Chatwin et al. |
| 2017/0310456 A1 | 10/2017 | Tajalli |
| 2018/0083638 A1 | 3/2018 | Tajalli |
| 2018/0083763 A1 | 3/2018 | Black et al. |
| 2018/0375693 A1 | 12/2018 | Zhou et al. |

OTHER PUBLICATIONS

Loh, Mattew, et al., "A 3×9 Gb/s Shared, All-Digital CDR for High-Speed, High-Density I/O", IEEE Journal of Solid-State Circuits, vol. 47, No. 3, Mar. 2012, 641-651 (11 pages).

Won, Hyosup, et al., "A 28-Gb/s Receiver With Self-contained Adaptive Equalization and Sampling Point Control Using Stochastic Sigma-Tracking Eye-Opening Monitor", IEEE Transactions on Circuits and Systems—I: Regular Papers, vol. 64, No. 3, Mar. 2017, 664-674 (11 pages).

Ha, J.C., et al., "Unified All-Digital Duty-Cycle and phase correction circuit for QDR I/O interface", Electronic Letters, The Institution of Engineering and Technology, vol. 44, No. 22, Oct. 23, 2008, 1300-1301 (2 pages).

Ryu, Kyungho, et al., "Process-Variation-Calibrated Multiphase Delay Locked Loop With a Loop-Enbedded Duty Cycle Corrector", IEEE Transactions on Circuits and Systems, vol. 61, No. 1, Jan. 2014, 1-5 (5 pages).

Wang, Yi-Ming, et al., "Range Unlimited Delay-Interleaving and -Recycling Clock Skew Compensation and Duty-Cycle Correction Circuit", IEEE Transactions on Very Large Scale Integration (VLSI) Systems, vol. 23, No. 5, May 2015, 856-868 (13 pages).

PHASE ROTATION CIRCUIT FOR EYE SCOPE MEASUREMENTS

CROSS-REFERENCE TO RELATED APPLICATIONS

This application is a continuation of U.S. application Ser. No. 15/603,404, entitled "Phase Rotation Circuit for Eye Scope Measurements", filed May 23, 2017, naming Armin Tajalli, which claims the benefit of U.S. Provisional Application No. 62/395,993, filed Sep. 16, 2016, entitled "Matrix Phase Detector Element for Phase Locked Loop", all of which are hereby incorporated by reference in their entirety for all purposes.

REFERENCES

The following prior applications are herein incorporated by reference in their entirety for all purposes:

U.S. Patent Publication 2011/0268225 of application Ser. No. 12/784,414, filed May 20, 2010, naming Harm Cronie and Amin Shokrollahi, entitled "Orthogonal Differential Vector Signaling" (hereinafter "Cronie I").

U.S. Patent Publication 2011/0302478 of application Ser. No. 12/982,777, filed Dec. 30, 2010, naming Harm Cronie and Amin Shokrollahi, entitled "Power and Pin Efficient Chip-to-Chip Communications with Common-Mode Resilience and SSO Resilience" (hereinafter "Cronie II").

U.S. patent application Ser. No. 13/030,027, filed Feb. 17, 2011, naming Harm Cronie, Amin Shokrollahi and Armin Tajalli, entitled "Methods and Systems for Noise Resilient, Pin-Efficient and Low Power Communications with Sparse Signaling Codes" (hereinafter "Cronie III").

U.S. patent application Ser. No. 13/176,657, filed Jul. 5, 2011, naming Harm Cronie and Amin Shokrollahi, entitled "Methods and Systems for Low-power and Pin-efficient Communications with Superposition Signaling Codes" (hereinafter "Cronie IV").

U.S. patent application Ser. No. 13/542,599, filed Jul. 5, 2012, naming Armin Tajalli, Harm Cronie, and Amin Shokrollahi entitled "Methods and Circuits for Efficient Processing and Detection of Balanced Codes" (hereafter called "Tajalli I".)

U.S. patent application Ser. No. 13/842,740, filed Mar. 15, 2013, naming Brian Holden, Amin Shokrollahi and Anant Singh, entitled "Methods and Systems for Skew Tolerance in and Advanced Detectors for Vector Signaling Codes for Chip-to-Chip Communication", hereinafter identified as [Holden I];

U.S. Provisional Patent Application No. 61/946,574, filed Feb. 28, 2014, naming Amin Shokrollahi, Brian Holden, and Richard Simpson, entitled "Clock Embedded Vector Signaling Codes", hereinafter identified as [Shokrollahi I].

U.S. patent application Ser. No. 14/612,241, filed Aug. 4, 2015, naming Amin Shokrollahi, Ali Hormati, and Roger Ulrich, entitled "Method and Apparatus for Low Power Chip-to-Chip Communications with Constrained ISI Ratio", hereinafter identified as [Shokrollahi II].

U.S. patent application Ser. No. 13/895,206, filed May 15, 2013, naming Roger Ulrich and Peter Hunt, entitled "Circuits for Efficient Detection of Vector Signaling Codes for Chip-to-Chip Communications using Sums of Differences", hereinafter identified as [Ulrich I].

U.S. patent application Ser. No. 14/816,896, filed Aug. 3, 2015, naming Brian Holden and Amin Shokrollahi, entitled "Orthogonal Differential Vector Signaling Codes with Embedded Clock", hereinafter identified as [Holden II].

U.S. patent application Ser. No. 14/926,958, filed Oct. 29, 2015, naming Richard Simpson, Andrew Stewart, and Ali Hormati, entitled "Clock Data Alignment System for Vector Signaling Code Communications Link", hereinafter identified as [Stewart I].

U.S. patent application Ser. No. 14/925,686, filed Oct. 28, 2015, naming Armin Tajalli, entitled "Advanced Phase Interpolator", hereinafter identified as [Tajalli II].

U.S. Provisional Patent Application No. 62/286,717, filed Jan. 25, 2016, naming Armin Tajalli, entitled "Voltage Sampler Driver with Enhanced High-Frequency Gain", hereinafter identified as [Tajalli III].

U.S. Provisional Patent Application No. 62/288,717, filed Apr. 22, 2016, naming Armin Tajalli, entitled "High Performance Phase Locked Loop", hereinafter identified as [Tajalli IV].

The following additional references to prior art have been cited in this application:

U.S. Pat. No. 6,509,773, filed Apr. 30, 2001 by Buchwald et al., entitled "Phase interpolator device and method" (hereafter called [Buchwald].

"Linear phase detection using two-phase latch", A. Tajalli, et al., IEE Electronic Letters, 2003, (hereafter called [Tajalli V].)

"A Low-Jitter Low-Phase-Noise 10-GHz Sub-Harmonically Injection-Locked PLL With Self-Aligned DLL in 65-nm CMOS Technology", Hong-Yeh Chang, Yen-Liang Yeh, Yu-Cheng Liu, Meng-Han Li, and Kevin Chen, IEEE Transactions on Microwave Theory and Techniques, Vol 62, No. 3, March 2014 pp. 543-555, (hereafter called [Chang et al.])

"Low Phase Noise 77-GHz Fractional-N PLL with DLL-based Reference Frequency Multiplier for FMCW Radars", Herman Jalli Ng, Rainer Stuhlberger, Linus Maurer, Thomas Sailer, and Andreas Stelzer, Proceedings of the 6th European Microwave Integrated Circuits Conference, 10-11 Oct. 2011, pp. 196-199, (hereafter called [Ng et al.])

"Design of Noise-Robust Clock and Data Recovery using an Adaptive-Bandwidth Mixed PLL/DLL", Han-Yuan Tan, Doctoral Thesis, Harvard University November 2006, (hereafter called [Tan]).

U.S. Pat. No. 7,492,850, filed Aug. 31, 2005 by Christian Ivo Menolfi and Thomas Helmut Toifl, entitled "Phase locked loop apparatus with adjustable phase shift" (hereafter called [Menolfi].)

"A Calibration-Free Fractional-N Ring PLL Using Hybrid Phase/Current-Mode Phase Interpolation Method", by Romesh Kumar Nandwana et al, IEEE Journal of Solid-State Circuits Vol. 50, No. 4, April 2015, ppg. 882-895, (hereafter called [Nandwana].)

FIELD OF THE INVENTION

The present embodiments relate to communications systems circuits generally, and more particularly to obtaining a stable, correctly phased receiver clock signal from a high-speed multi-wire interface used for chip-to-chip communication.

BACKGROUND

In modern digital systems, digital information has to be processed in a reliable and efficient way. In this context, digital information is to be understood as information available in discrete, i.e., discontinuous values. Bits, collection of bits, but also numbers from a finite set can be used to represent digital information.

In most chip-to-chip, or device-to-device communication systems, communication takes place over a plurality of wires to increase the aggregate bandwidth. A single or pair of these wires may be referred to as a channel or link and multiple channels create a communication bus between the electronic components. At the physical circuitry level, in chip-to-chip communication systems, buses are typically made of electrical conductors in the package between chips and motherboards, on printed circuit boards ("PCBs") boards or in cables and connectors between PCBs. In high frequency applications, microstrip or stripline PCB traces may be used.

Common methods for transmitting signals over bus wires include single-ended and differential signaling methods. In applications requiring high speed communications, those methods can be further optimized in terms of power consumption and pin-efficiency, especially in high-speed communications. More recently, vector signaling methods have been proposed to further optimize the trade-offs between power consumption, pin efficiency and noise robustness of chip-to-chip communication systems. In those vector signaling systems, digital information at the transmitter is transformed into a different representation space in the form of a vector codeword that is chosen in order to optimize the power consumption, pin-efficiency and speed trade-offs based on the transmission channel properties and communication system design constraints. Herein, this process is referred to as "encoding". The encoded codeword is communicated as a group of signals from the transmitter to one or more receivers. At a receiver, the received signals corresponding to the codeword are transformed back into the original digital information representation space. Herein, this process is referred to as "decoding".

Regardless of the encoding method used, the received signals presented to the receiving device are sampled (or their signal value otherwise recorded) at intervals best representing the original transmitted values, regardless of transmission channel delays, interference, and noise. This Clock and Data Recovery (CDR) not only determine the appropriate sample timing, but may continue to do so continuously, providing dynamic compensation for varying signal propagation conditions.

Many known CDR systems utilize a Phase-Locked Loop (PLL) or Delay-Locked Loop (DLL) to synthesize a local receive clock having an appropriate frequency and phase for accurate receive data sampling.

BRIEF DESCRIPTION

To reliably detect the data values transmitted over a communications system, a receiver accurately measures the received signal value amplitudes at carefully selected times. Various methods are known to facilitate such receive measurements, including reception of one or more dedicated clock signals associated with the transmitted data stream, extraction of clock signals embedded within the transmitted data stream, and synthesis of a local receive clock from known attributes of the communicated data stream.

In general, the receiver embodiments of such timing methods are described as Clock-Data Recovery (CDR), often based on Phase-Lock Loop (PLL) or Delay-Locked Loop (DLL) synthesis of a local receive clock having the desired frequency and phase characteristics.

In both PLL and DLL embodiments, a Phase Detector compares the relative phase (and in some variations, the relative frequency) of a received reference signal and a local clock signal to produce an error signal, which is subsequently used to correct the phase and/or frequency of the local clock source and thus minimize the error. As this feedback loop behavior will lead to a given PLL embodiment producing a fixed phase relationship (as examples, 0 degrees or 90 degrees of phase offset) between the reference signal and the local clock, an additional fixed or variable phase adjustment is often introduced to permit the phase offset to be set to a different desired value (as one example, 45 degrees of phase offset) to facilitate receiver data detection.

Statistical graphs of received data over time, commonly called "eye diagrams" are a well-known tool for analyzing received signal quality. Capturing the data needed to plot such a diagram may include measuring received signals at multiple sampling points distributed across both signal amplitude and time. To avoid disruption of normal data reception, one or more additional data samplers may be provided to perform these measurements independent of the amplitude threshold and time interval chosen for optimum data reception.

Methods and systems are described for obtaining eye measurements by generating a data-sampling clock and a variable-phase-offset eye-measurement clock with a local oscillator and an adjustable phase interpolator, using said sampling clock with a data slicer to obtain a receive sample of a received data signal obtained using a multi-input comparator, and using at least one eye slicer and the variable-phase-offset eye-measurement clock to obtain a plurality of eye characteristic measurements by adjusting a sampling threshold of the at least one eye slicer and a phase offset of the variable-phase-offset eye-measurement clock.

DETAILED DESCRIPTION

Figure 1:
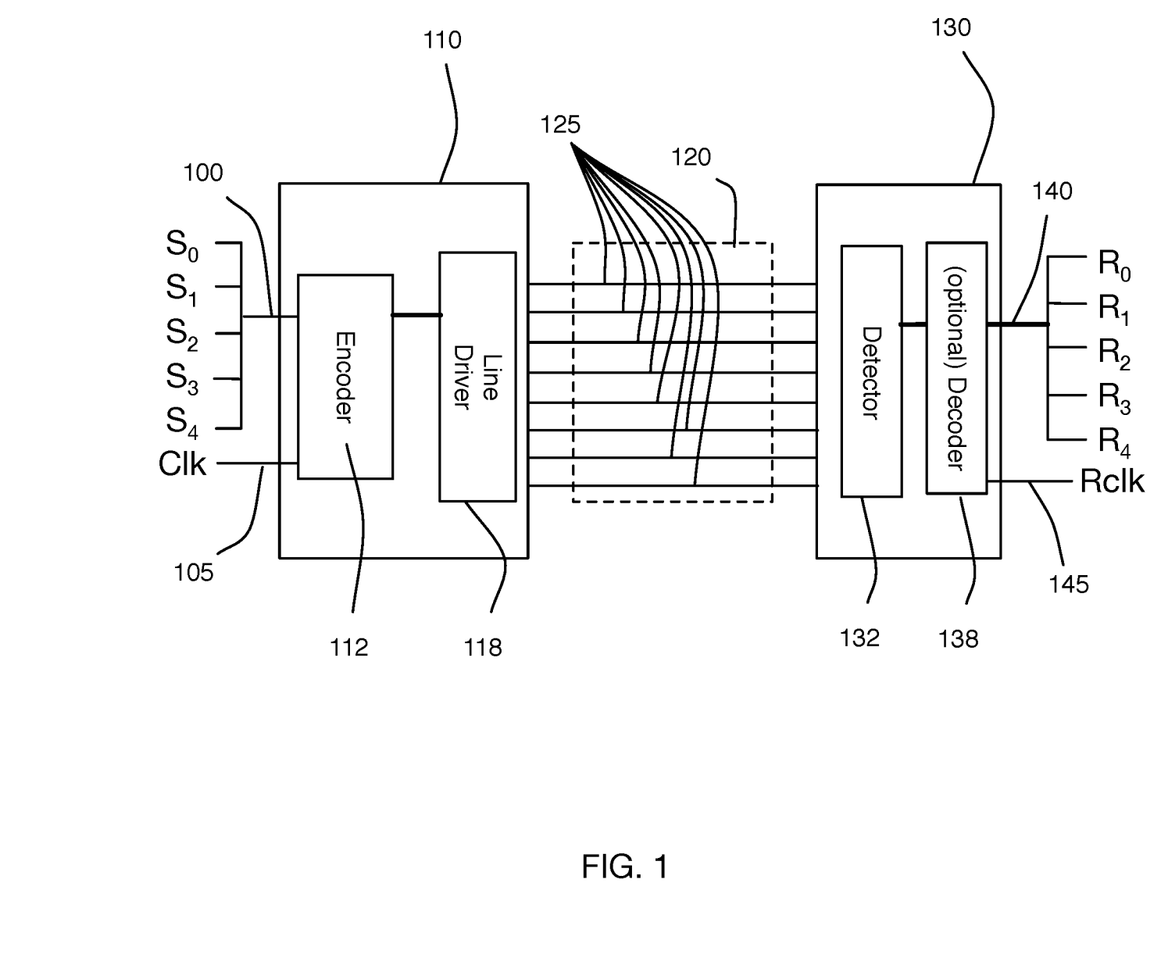
FIG. 1 is a block diagram of a system capable of encoding and transmitting five data bits and a clock on an eight wire communications channel.

As described in [Cronie I], [Cronie II], [Cronie III] and [Cronie IV], vector signaling codes may be used to produce extremely high bandwidth data communications links, such as between two integrated circuit devices in a system. As illustrated by the embodiment of FIG. 1, multiple data communications channels transmit symbols of the vector signaling code, acting together to communicate codewords of the vector signaling code. Depending on the particular vector signaling code used, the number of channels comprising a communications link may range from two to eight or more, and may also communicate one or more clock signals on separate communications channels or as subchannel components of the vector signaling code. In the example of FIG. 1, communication link 120 is illustrated as being composed of eight wires 125, collectively communicating five data values 100 and one clock 105 between transmitter 110 and receiver 130.

Some embodiments additionally support additional modes of operation in which, as one example, some number of data communications channels are reconfigured to support legacy communications protocols such as non-return-to-zero (NRZ) differential signaling.

Embodiments described herein can also be applied to prior art permutation sorting methods not covered by the vector processing methods of [Cronie II], [Cronie III], [Cronie IV], and/or [Tajalli I]. More generally, embodiments may apply to any communication or storage methods requiring coordination of multiple channels or elements of the channel to produce a coherent aggregate result.

Receiver Data Detection

Figure 2:
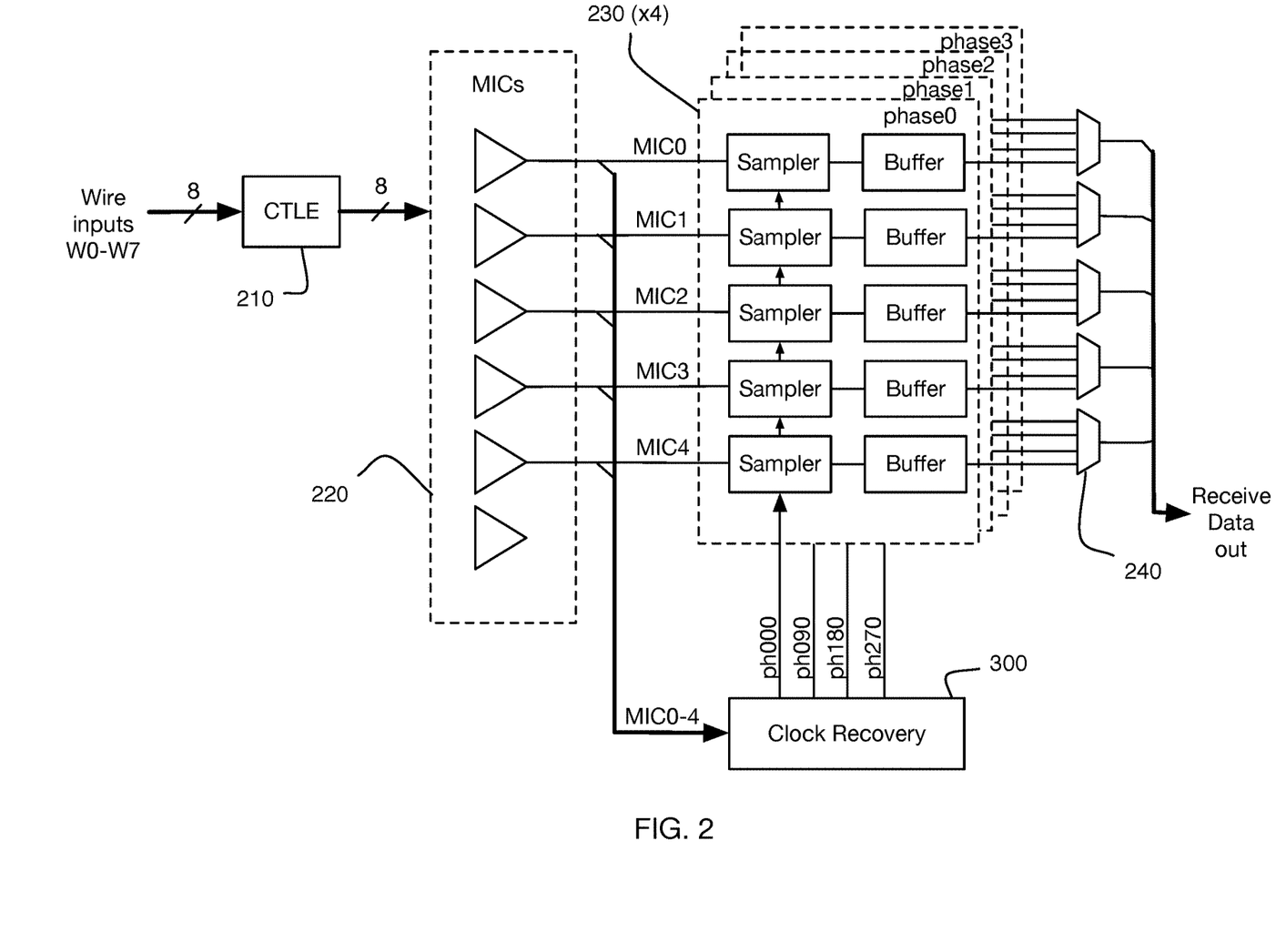
FIG. 2 is a block diagram of one embodiment of a receiver compatible with the system of FIG. 1.

To provide context for the following examples, one typical high-speed receiver embodiment [Stewart I] is used for illustrative purposes, without limitation. As illustrated in FIG. 2, the example data receiver includes eight identical Continuous Time Linear Equalization (CTLE) stages 210 operating on the signals received on the eight wires, previously shown as 120 in FIG. 1.

As described in [Tajalli I], [Holden I] and [Ulrich I], vector signaling codes may be efficiently detected by linearly combining sets of input signals using Multi-Input comparators or mixers (MIC). For the 5b6w code used by the example receiver, five such mixers acting on weighted subsets of the six received data input signals will detect the five data bits without need of further decoding. In one embodiment, one additional mixer acting on combinations of the two received clock signals will similarly detect the clock signal.

Other embodiments may forgo the dedicated wires used to communicate a separate clock signal, and instead the receiver extracts a clock from transitions occurring on the data lines themselves. FIG. 2 illustrates a set of five MIC mixers 220 operate on the received and equalized signals to produce detected signals MIC0-MIC4, with transitions on those data lines collectively used to synchronize a local clock generator 300.

As is well understood in the art, successful application of this technique benefits from a sufficiently large transition density on the data lines (which may be alternatively interpreted as requiring a sufficiently small interval between transitions) and/or sufficient free-running frequency stability within the PLL to maintain accurate data sample timing during non-transition intervals. [Shokrollahi I] describes suitable vector signaling codes having such guaranteed transition density. Alternatively, known art transition-enforcing encoding such as the commonly utilized 8b10b and 64b66b codes may be applied to all or some subset of the data encoded for transmission to insure a guaranteed minimum transition density at the receiver. In one embodiment, bit level transition encoding may be performed on the composite data bit stream, or may be applied to a bit stream being applied to given subchannel, or may be applied to bits being modulated onto subchannels in a given transmit and/or receive slice, or applied to bits being modulated onto a given subchannel (or each subchannel) in each slice.

Because of the high data rates involved, multiple parallel phases of receive processing are shown in the example receiver. In the illustrated example, the five detected data signals MIC0-MIC4 are processed in four parallel phases of receive data processing, each phase 230 including data sampling and subsequent buffering, followed by recombination of the four phase outputs into a received data stream, shown in FIG. 2 as being performed by multiplexers 240.

Clock Recovery circuits (also known in the art as Clock Data Recovery or CDR) support such sampling measurements by extracting timing information, either from the data lines themselves or from dedicated clock signal inputs, and utilize that extracted information to generate clock signals to control the time interval used by the data line sampling device(s). The actual clock extraction may be performed using well known circuits such as a Phase Locked Loop (PLL) or Delay Locked Loop (DLL), which in their operation may also generate higher frequency internal clocks, multiple clock phases, etc. in support of receiver operation. In the embodiment of FIG. 2, the detected clock signal is obtained from data transitions on MIC0-MIC4 and processed 300 to extract properly timed sampling clocks for the four data phases.

Receiver Clock Recovery

Figure 3:
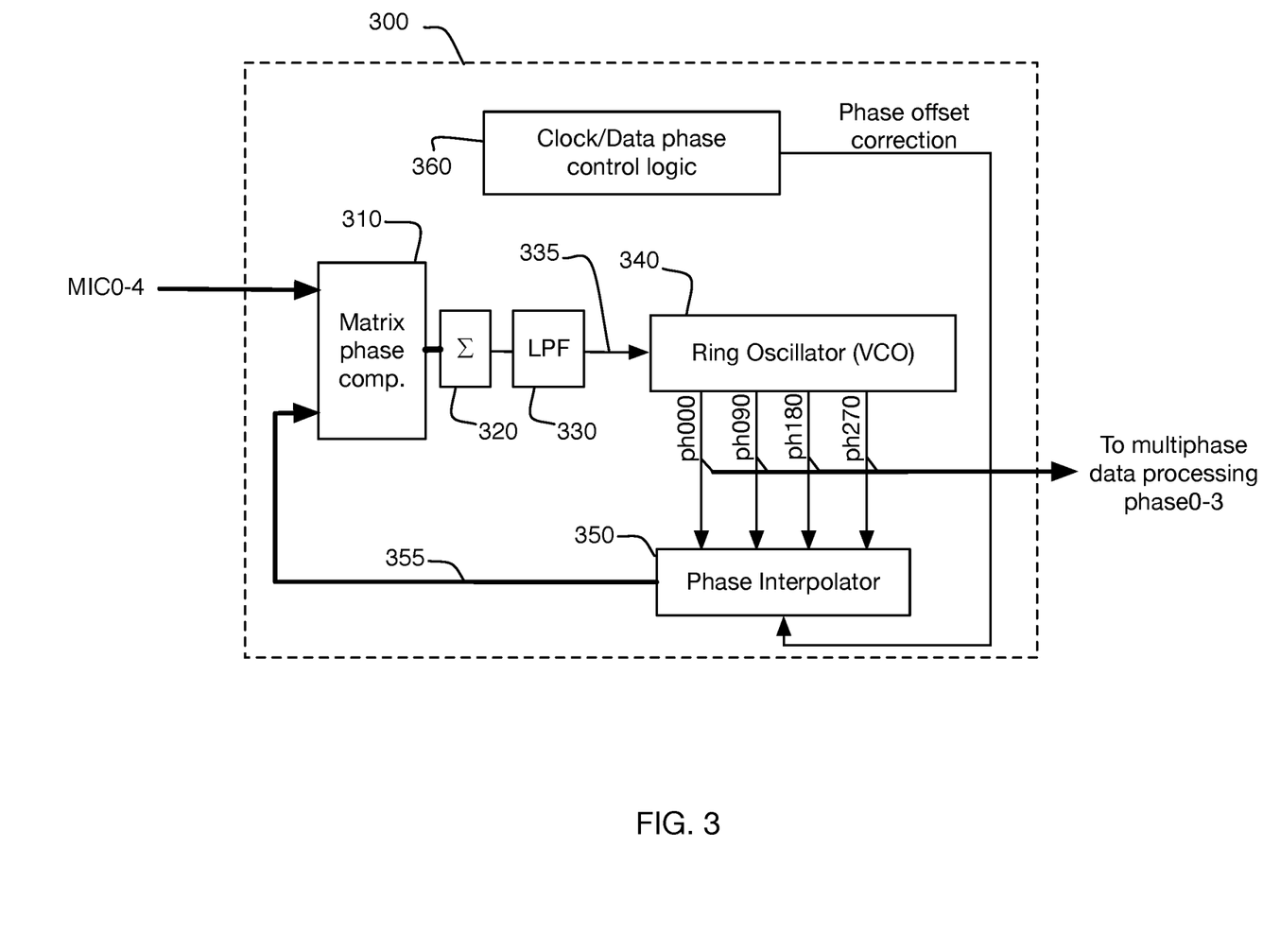
FIG. 3 is a block diagram detailing one embodiment of the clock recovery circuit used by the receiver of FIG. 2.

The example receiver utilizes a PLL embodiment as shown in FIG. 3. This PLL accepts the received data signals MIC0-MIC4, transitions of which act as the reference to which the PLL clocks will be phased locked. A Matrix Phase Comparator 310 as described in [Tajalli IV] compares these reference data transitions to internal clocks derived from the VCO, producing a set of phase error results which are in turn summed 320 and low pass filtered 330 to provide an Error value 335 which subsequently corrects the operating frequency of Ring Oscillator VCO 340. In some embodiments, the outputs of Phase Comparator 310 are digital waveforms requiring conversion to an analog error signal, either through implicit or explicit digital to analog conversion, or by use of an interface element such as a charge pump. Some embodiments may combine such conversion with all or part of the low pass filtering operation, as one example offered without limitation, by the digital filtering behavior shown by the switching action of a charge pump directed by digital control signals generating an analog signal output.

In one embodiment, ring oscillator 340, including a sequence of identical gates in a closed loop, is used as the internal Voltage Controlled Oscillator (VCO) timing source for the PLL. The VCO frequency is varied by analog adjustment of at least one of gate propagation delay, intergate rise and fall time, and gate switching threshold within the ring oscillator. This may be implemented via switched capacitor banks, where a digital control signal is applied to selective place capacitive elements in parallel and/or series combinations to alter an RC time constant, as one non-limiting example. Still further, a current source that drives a gate of the ring oscillator may be increased or decreased to alter the output switching rise-time/fall-time, and thereby adjust the effective delay. Outputs taken at equal intervals (i.e. separated by equal numbers of ring oscillator gates) along the sequence of gates comprising the ring oscillator provide the four data phase sampling clocks, herein identified as the 0, 90, 180, and 270 degree clocks.

In one embodiment, the ring oscillator is composed of eight identical sets of logic gates (e.g., a set of inverter circuits), thus the phase difference from one such set to the next is 45 degrees. In this embodiment, the 0, 90, 180, and 270 degree outputs may be obtained, as examples, from the second, fourth, sixth, and eighth outputs. As these clocks are cyclical, the final tap may be considered as logically adjacent to the initial tap, a 0 degree and a 360 degree phase offset being equivalent. As many variations of such designs are known in the art, neither the number of elements in the ring oscillator nor the specific taps at which particular outputs are made should be construed as implying a limitation. As one example, the location of the 0 degree tap is arbitrary, as one familiar with the art will recognize that normal PLL behavior will phase align the ring oscillator with the external phase reference regardless of its initial phase. Similarly, equivalent designs may be obtained in which the output clock phases do not have square wave duty cycles; as one example being produced by the action of AND or OR gates with inputs from different tap locations. In the example receiver, it is desired that the VCO operate at a multiple of the received reference clock frequency, thus Frequency Divider 350 divides the VCO outputs by a comparable amount prior to the Phase Detector. In one embodiment, binary (factor of two) dividers are incorporated at 350 to obtain the correct sampling clock rate. In another embodiment, no divider is utilized and the VCO outputs are presented to the phase interpolator directly.

Each of the four phases of sampling clocks is appropriately timed to sample received data for one of the four parallel processing phases. In particular, internal clock ph000 is aligned to optimally trigger data samplers in the phase0 phase of processing, clock ph090 in phase1, clock ph180 in phase2, and clock ph270 in phase3.

To allow the overall phase of the locked PLL signals to be offset from the reference clock input phase, the local clock outputs presented to the phase comparator may be modified by phase interpolator 350, the output phase of which is controllably intermediate between its input clock phases. Thus, the PLL may lock with its fixed phase relationship, while the internal clock signals obtained from ring oscillator 340 will be offset from that fixed phase by the phase delay amount introduced by phase interpolator 350, as controlled by signal Phase offset correction. Phase interpolators are known in the art, examples being provided by [Buchwald I] and [Tajalli II].

In one embodiment, phase interpolator 360 receives multiple clock phases from the ring oscillator 340 having 90 degree phase differences. Said phase interpolator may be controlled to select two adjacent clock input phases and then to interpolate between them so as to produce an output at a chosen phase offset between those selected two values. For purposes of description, it may be assumed that a phase detector design is used which drives the PLL to lock with a zero phase differential between the two phase detector inputs. Thus, continuing the example, applying the 0 and 90 degree clock phases as inputs to the phase interpolator allows adjustment such that the PLL leads the reference clock input by between 0 and 90 degrees.

It will be apparent that equivalent results with comparable phase offsets may be obtained using other pairs of degree clocks and/or other phase detector designs, which as previously described may lock with different phase differentials than that of the present example. Thus neither the particular phase clocks chosen nor the particular phase detector design described herein are limiting.

In the known art, [Nandwana] describes a Fractional-N clock multiplying PLL in which a single reference clock is phase compared to two local clocks derived using different integer divisor ratios, with interpolation between the two phase error results dynamically chosen to cancel the phase quantization error.

Data-Driven Phase Comparator

Considering the multiple data inputs being monitored by Matrix Phase Comparator 310, several operational considerations are apparent. First, as any received data bit may remain in either the "1" or "0" state in consecutive unit intervals, only data transitions between those states are relevant to PLL phase. In particular, between any two consecutive unit intervals a transition may or may not occur in any given data bit; indeed, no transition may occur on any data bit in a given clock interval. If a transition does occur, the matrix phase comparator may utilize the timing of that transition to update the PLL clock phase, while if no transition occurs, the PLL clock should be allowed to continue unchanged. If two or more data lines transition in the same clock interval, the timing errors derived from each such transition may be summed, which is consistent with the previously-described matrix phase comparator behavior.

Figure 5:
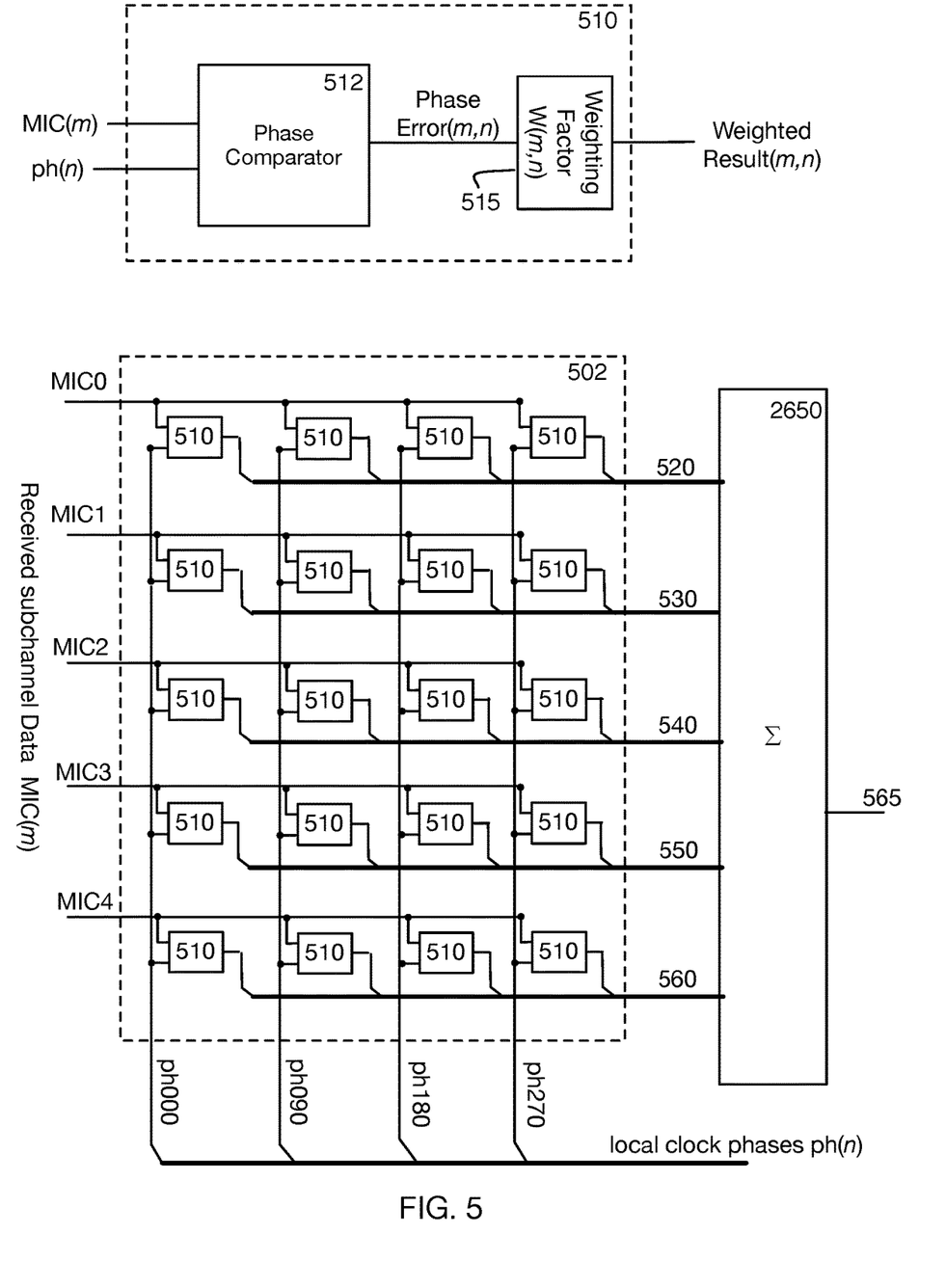
FIG. 5 is a block diagram of a matrix phase comparator operating on detected data signals, in accordance with some embodiments.
Figure 7:
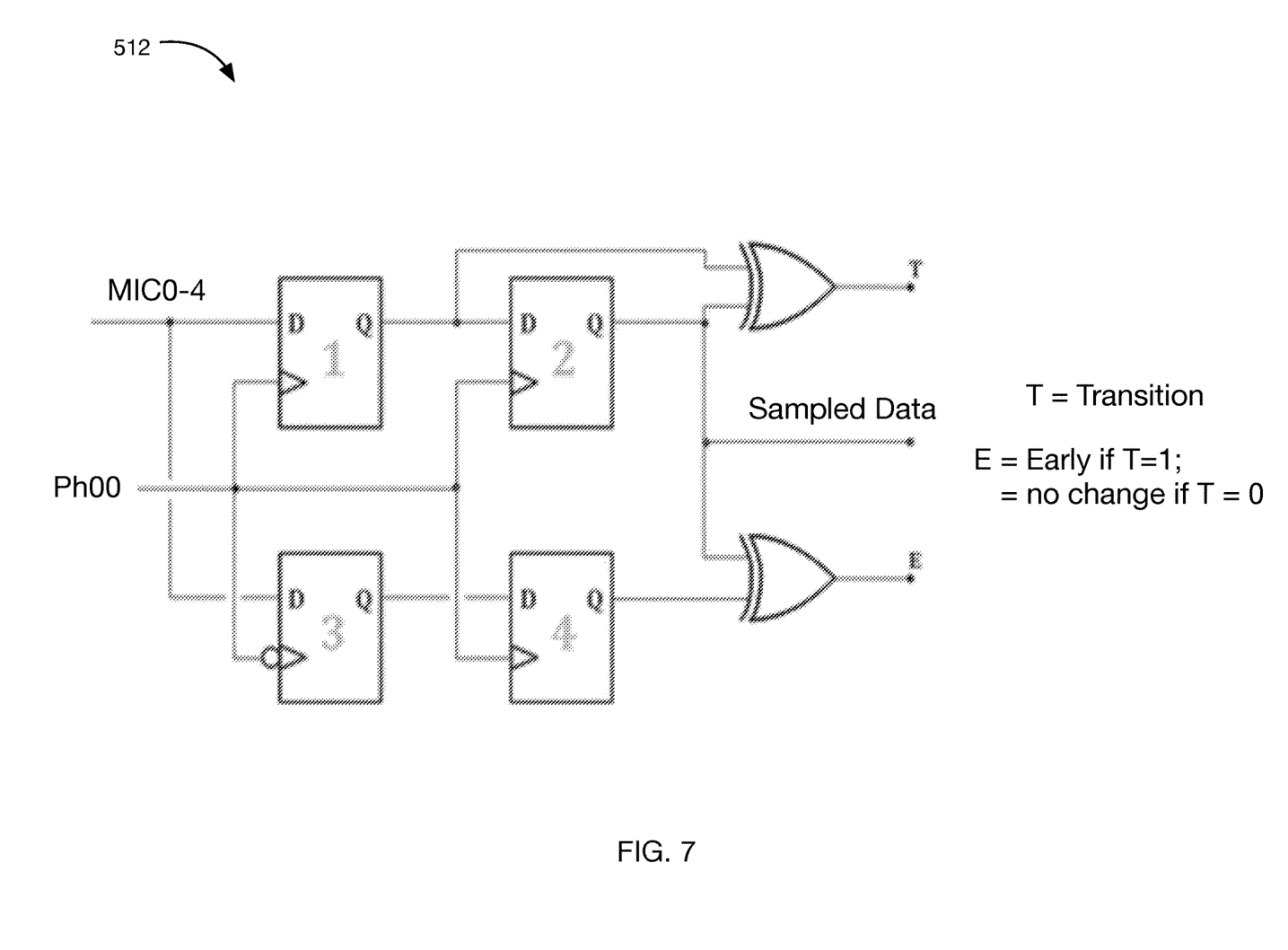
FIG. 7 is a block diagram of an edge-triggered bang-bang phase detector.
Figure 8:
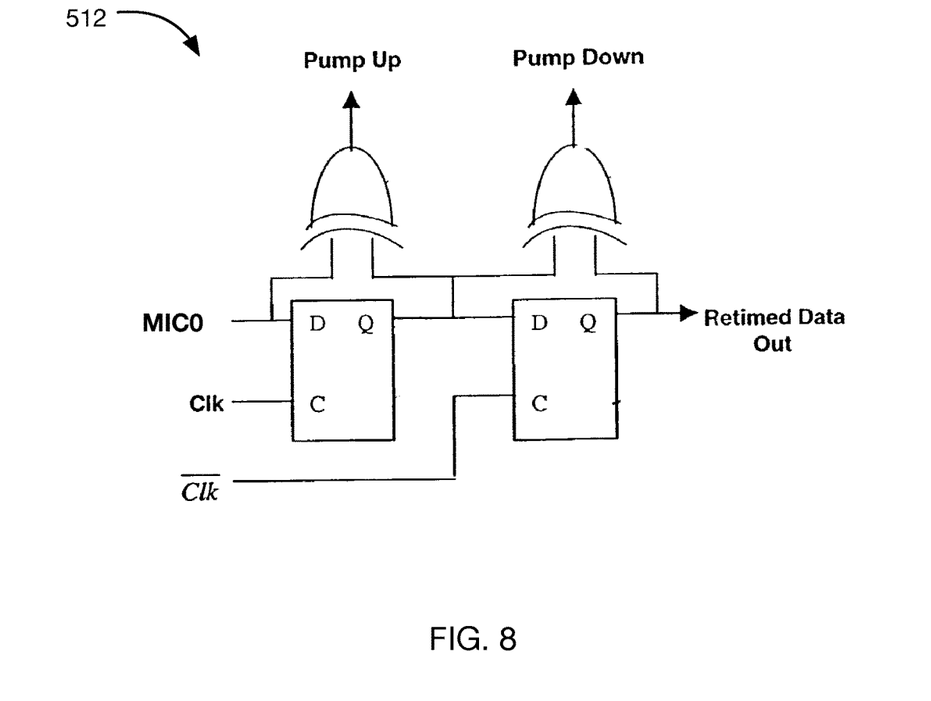
FIG. 8 is a block diagram of a linear edge-triggered phase detector.
Figure 9:
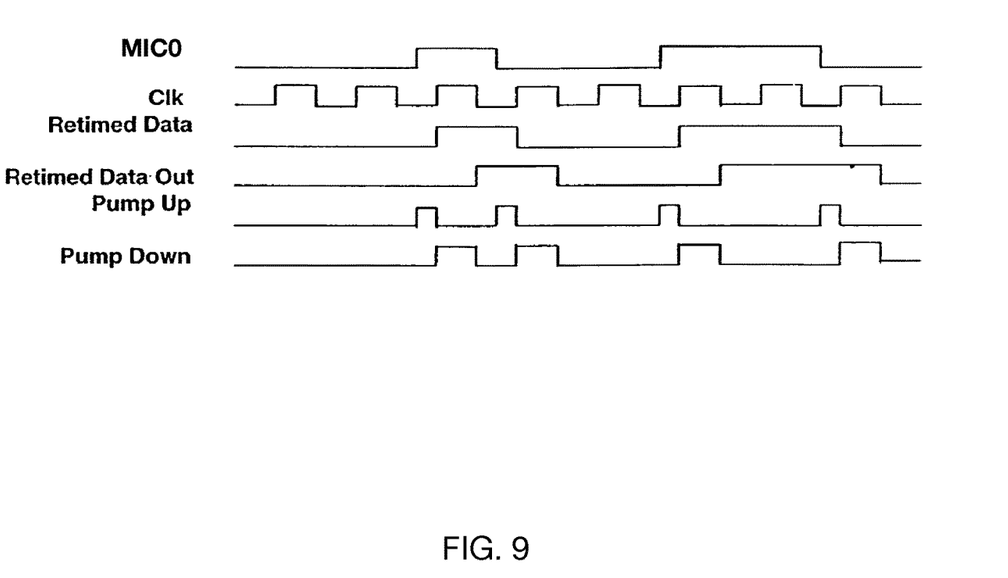
FIG. 9 is a wave-form associated with the linear edge-triggered phase detector of FIG. 8.

This behavior suggests that a state-machine phase detector may be a suitable candidate for the phase comparison elements of the comparison matrix, as such designs may be configured to respond only to signal transitions rather than signal level, and may be configured to output a "no change" result in the absence of a signal transition. In some embodiments, the partial phase comparators 512 shown in FIG. 5 may take the form of edge-triggered bang-bang detectors configured to generate partial phase-error signals in response to determining a transition occurred. A block diagram of an exemplary edge-triggered bang-bang phase detector is shown in FIG. 7. In some embodiments, the partial phase comparators may take the form of linear edge-triggered phase detectors to generate partial phase-error signals in response to determining a transition occurred. A block diagram of a linear edge-triggered phase detector is illustrated in FIG. 8, and a corresponding waveform is shown in FIG. 9.

Another embodiment may incorporate data signal transition detectors, one example including an XOR gate comparing a data signal with a slightly time delayed copy of the same data signal, for example after passing through a logic buffer gate. Such an embodiment will output a logical pulse at each transition, and the edge of such pulse may be phase compared to a PLL clock edge, using any phase detector as previously described. An advanced embodiment may further incorporate a gating or time windowing function in the partial phase comparators, to produce a "no change" error result from any phase detector not receiving a data signal transition in a given time interval.

In some embodiments, the partial phase-error signals are analog signals formed using respective charge pump circuits. In such embodiments, the method further includes filtering the composite phase-error signal.

In some embodiments, the method further includes introducing, for a given partial phase comparator, a sub-channel specific delay into the corresponding phase of the local oscillator signal, the sub-channel specific delay associated with the data signal received at the given partial phase comparator.

In some embodiments, the comparison of the corresponding phase of the local oscillator signal and the corresponding data signal is formed using a linear edge-triggered phase detector. Alternatively, the comparison of the corresponding phase of the local oscillator signal and the corresponding data signal may be formed using an edge-triggered bang-bang phase detector.

In some embodiments, the method further includes applying a weight to the partial phase-error signal. In some embodiments, the plurality of data signals have a collective transition density above a predetermined threshold. In some embodiments, the method further includes outputting a no-change result in response to determining no transition occurred. In such embodiments, outputting the no-change result includes setting the partial phase comparator in a high-impedance state.

Multi-Modal Data-Driven Clock Recovery Circuit

Figure 10:
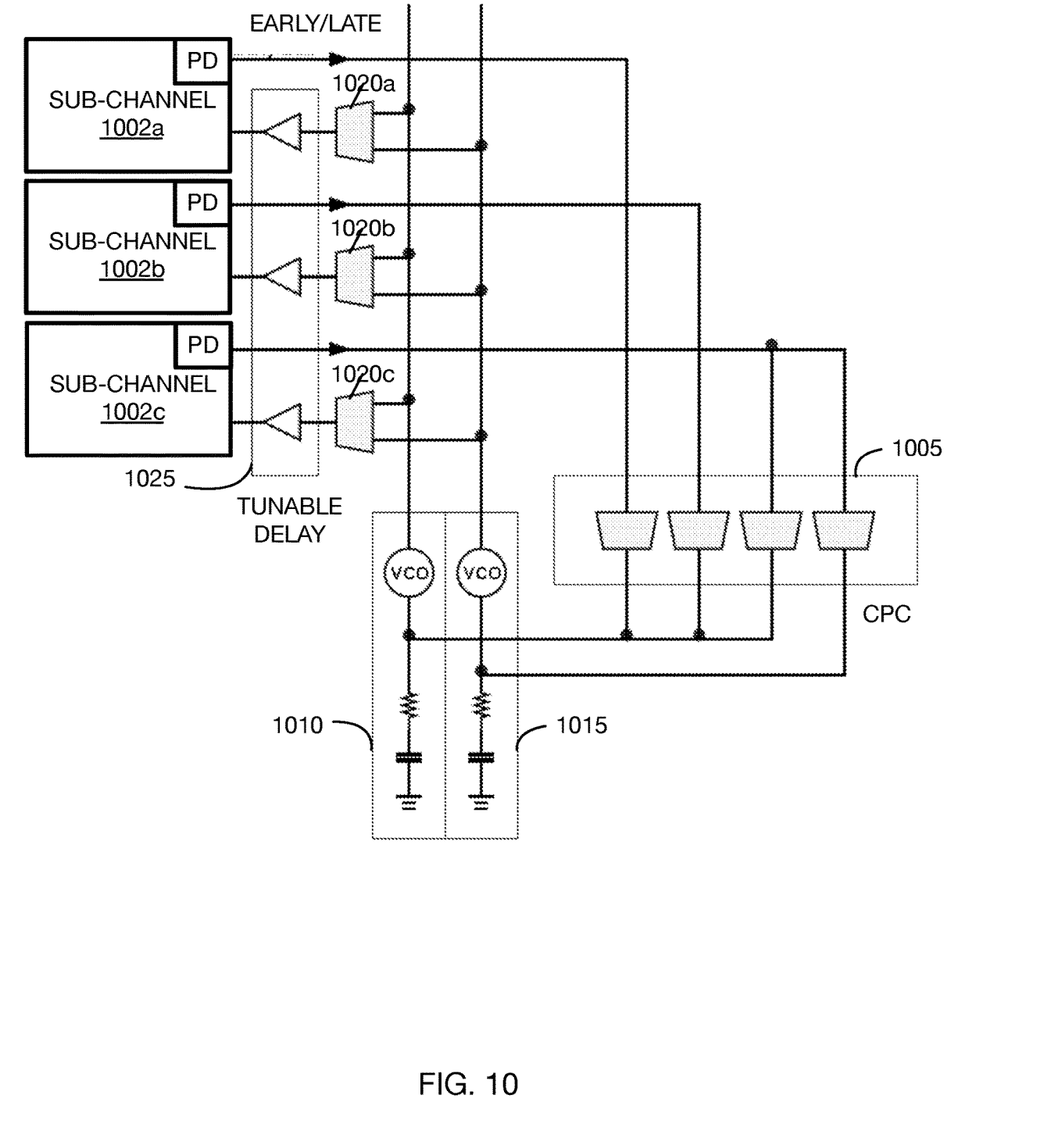
FIG. 10 is a block diagram of a multi-modal data-driven clock recovery circuit, in accordance with some embodiments.

In some embodiments, a data-driven clock recovery circuit may be configurable to operate in various modes, including a legacy mode. FIG. 10 illustrates an exemplary multi-modal data-driven clock recovery circuit, in accordance with some embodiments. As shown, the multi-modal data-driven clock recovery circuit includes a plurality of sub-channels 1002a/1002b/1002c, which may take the form of MICs as shown in FIG. 33, and may or may not also have a multi-phase receiver configuration such as shown in FIG. 25. Further, each sub-channel may include a data-driven phase detector (PD) element configured to generate a partial phase-error signal representing an early/late indication with respect to local oscillator signals provided by VCO circuits 1010 and/or 1015.

Figure 11:
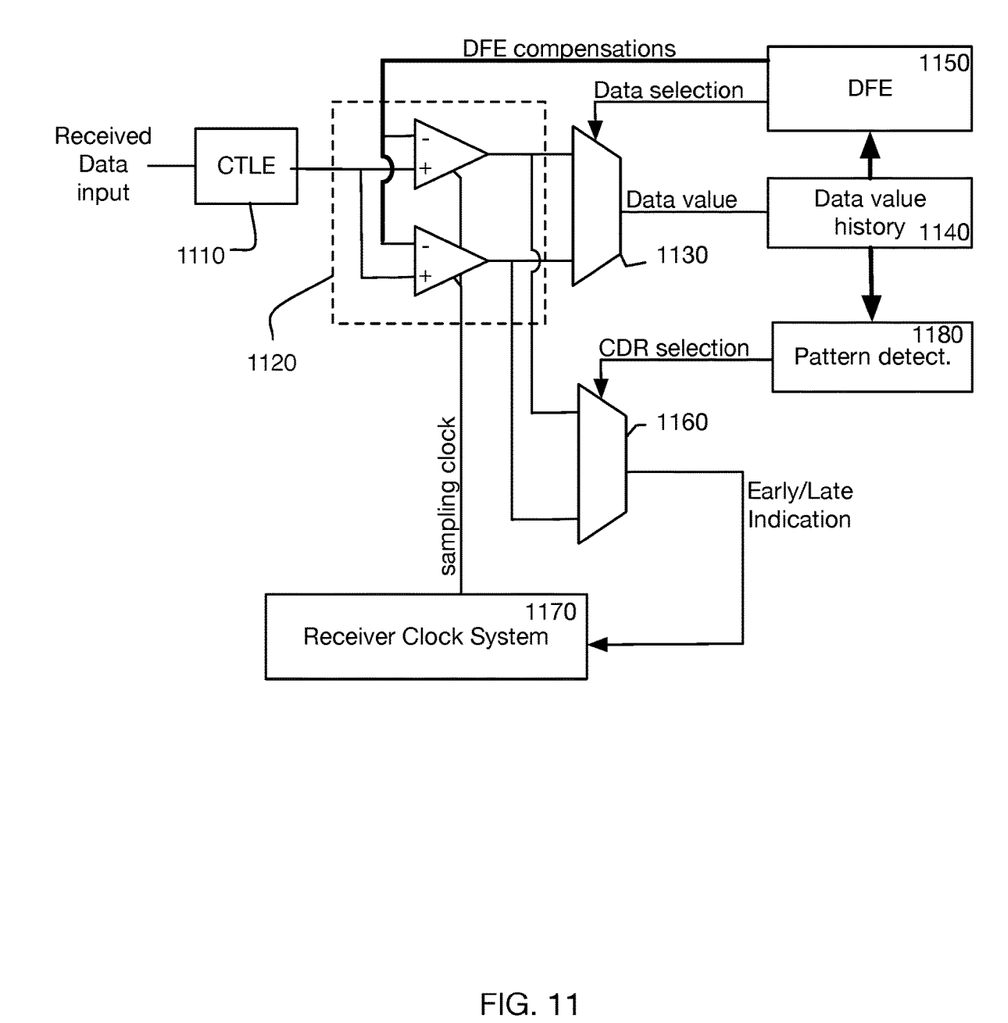
FIG. 11 is a block diagram of a receiver utilizing Decision Feedback Equalization to detect one sub-channel of a vector signaling code, and concurrently obtain an Early/Late Indication to correct the phase of the Receiver Clock System.

In particular, such a data-driven PD may be implemented as shown in FIG. 11, where two separate slicer elements 1120 are used to measure the output of the MIC. Note that each slicer uses a DFE-based offset voltage, where one uses the positive DFE offset, and the other uses a negative DFE offset, both of which are applied over the DFE compensations connections. (That is, one such DFE offset is associated with a speculative or "unrolled" DFE correction factor assuming the previous data bit was a one, and the other such DFE offset is associated with a speculative or "unrolled" DFE correction factor assuming the previous data bit was a zero.) In this way, once a data decision for a prior bit that was conveyed on the subchannel has been made by DFE unit 1150, that decision may be used to select one slicer output as a valid data signal having had an appropriate DFE compensation applied to it (by via mux 1130), while the other slicer (offset in the opposite amplitude direction) provides a useful early/late determination and is selected by mux 1160 as an early/late detection. Charge pump circuits 1005 may receive the early/late indications and provide a composite phase-error signal to provide to VCO 1010, which may include a loop filter illustrated by the series-connected resistor and capacitor. Note that in the embodiment shown in FIG. 10, the VCO loop control signal is generated in the analog signal domain and thus provides a loop bandwidth that is generally higher than loop control based solely on digital error filtering and integration/accumulation.

In a first mode of operation, the circuit may utilize all three sub-channels 1002a/1002b/1002c. The number of sub-channels is shown as three purely for illustrative purposes, and is not considered limiting, as higher orders of orthogonal ensemble non-return-to-zero (ENRZ) signaling may be used. In some embodiments, each sub-channel may include a MIC. FIG. 33 illustrates an exemplary configuration of a network of three MICs, in accordance with some embodiments. The network of MICs shown in FIG. 33 may be utilized in an ENRZ coding scheme. As shown, the three MICs are connected to a multi-wire bus having four wires, w0-w3. The output of each MIC represents a linear combination of codeword symbols received on the four wires. For purposes of clock recovery, data signal transitions are compared via phase detectors to a phase of a local oscillator signal provided by VCO 1010. The partial phase-error signals formed by individual charge pump circuits 1005 operating on the early/late indications are summed together to generate a composite phase-error signal and provided to VCO 1010 to make phase/frequency adjustments to VCO 1010. As shown in FIG. 10, the circuit may include tunable delay elements 1025 to account for sub-channel specific skew, as described above. Further, in the case that one or more sub-channels do not have data transitions, the corresponding charge pump output may be set in a high-impedance state or otherwise output a "no-change" indication.

In a legacy mode of operation, sub-channel 1002b may be switched off, and the circuit may be operated in a non-return-to-zero (NRZ) mode of operation, with sub-channels 1002a and 1002c each receiving a differential data signal over a respective pair of wires of the four-wires bus. In such an embodiment, the MIC of sub-channel 1002a may be connected to wires w0/w1 while wires w2/w3 are disconnected, while the MIC of sub-channel 1002c may be connected to wires w2/w3 with wires w0/w1 being disconnected. The output of sub-channel 1002c may be directed to adjust a second VCO 1015 via the right-most charge pump circuit, which may have an independent frequency and/or phase relationship with respect to VCO 1010. Selection element 1020c directs the phase provided by VCO 1015 to sub-channel 1002c to generate the early-late indication associated with sub-channel 1002c. Selection elements 1020a and 1020b are shown for illustrative purposes to illustrate symmetry, however it should be noted that selection elements 1020a and 1020b may be omitted in some embodiments, as sub-channels 1002a and 1002b are, in most embodiments, only connected to VCO 1010 (e.g., as shown in FIG. 10). In some embodiments, selection elements 1020a and 1020b may be included for loading purposes and to keep the circuitry consistent across each sub-channel. In such embodiments, the input to selection elements 1020a and 1020b connected to VCO 1015 may alternatively be tied to VDD or ground, or disconnected. It should be noted that the combination of sub-channels operating in legacy mode may vary, and the configuration shown in FIG. 10 illustrates only one possible configuration. In some embodiments, similar operations may be performed using a different number of sub-channels, such as the embodiment utilizing five sub-channels connected to six wires shown in FIG. 2.

In a further embodiment, configurable delay elements may be introduced between receiver clock system 1170 and each subchannel's samplers 1120, to allow incremental correction of timing variations among the multiple subchannels. Using the previous three subchannel system as an example offered without implying limitation, it may be observed that the signals received on subchannel 2 transition later than those of subchannels 1 and 3, thus the early/late indications from subchannel 2 indicate an "early" clock, even though subchannels 1 and 3 do not. In such a situation, the delay element associated with subchannel 2 may be configured to introduce a slight delay, moving its sampling time later relative to the overall clock timing. In at least one embodiment, individual clock source selections may be made for the subchannel samplers associated with data and clock edge detection, and with auxillary functions such as gathering statistical eye graph data and calibration. In such an embodiment, clock source selections include at least the unmodified clock provided by the Receiver Clock System, the incrementally delayed clock provided by the configurable delay element, and may also include a separately adjustable clock used for statistical eye graph sampling.

Obtaining Eye Diagram Measurements

The value of such "eye diagram" measurements is well understood in the art, providing an easily-understood presentation of multiple receiver characteristics, including receive signal amplitude margin, timing margin, and a rough determination of error rate. Other characteristics, including bandwidth, equalization, system gain, etc. may also be inferred. Such data may suggest or initiate system adjustments or controls, including transmit power adjustment, receiver gain adjustment, baud rate adjustment, and receive equalization adjustment.

Figure 6:
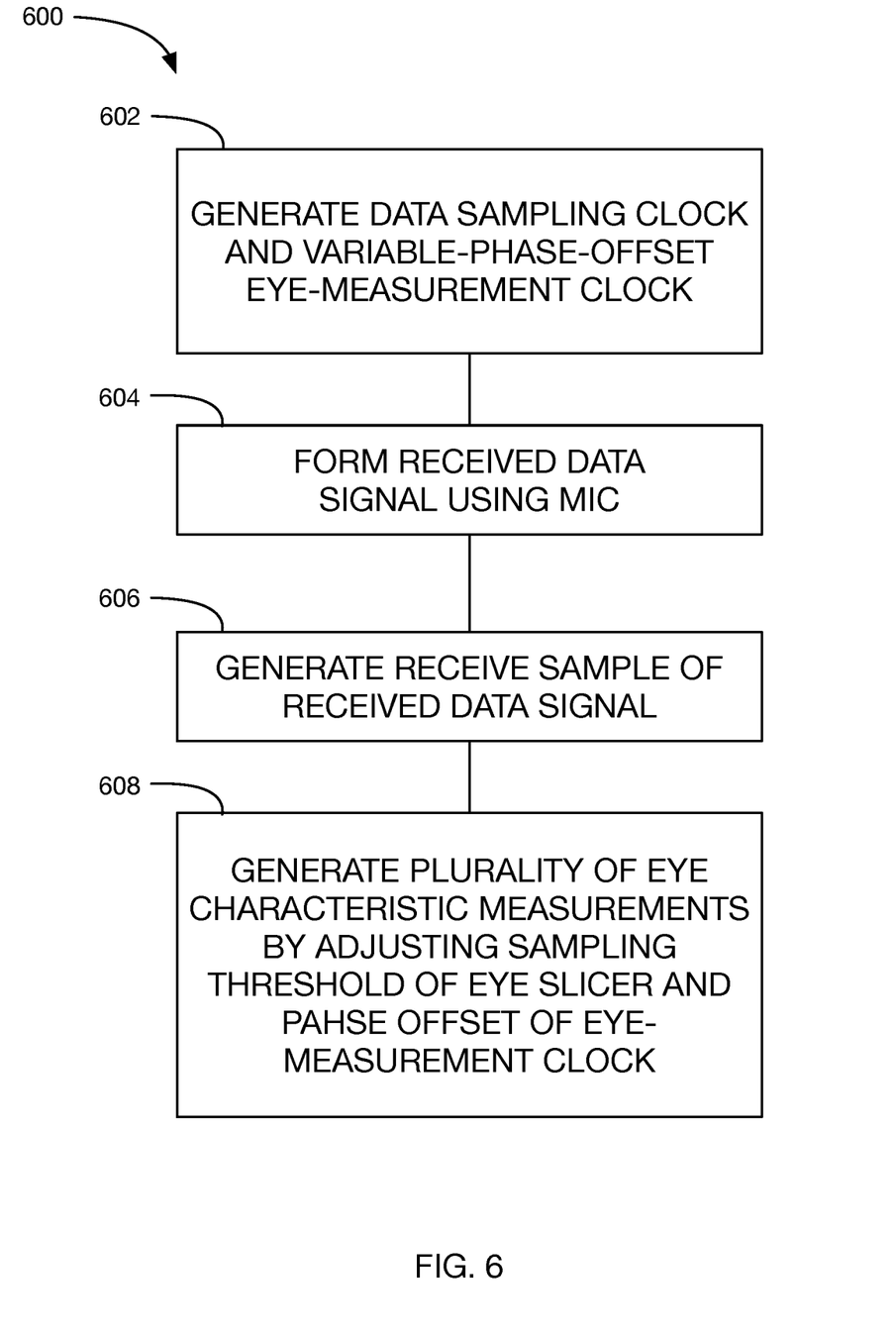
FIG. 6 is a flowchart of a method, in accordance with some embodiments.

FIG. 6 is a flowchart of a method 600, in accordance with some embodiments. As shown, method 600 includes generating 602, with a local oscillator and an adjustable phase interpolator, a data sampling clock and a variable-phase-offset eye measurement clock, forming 604 a received data signal using a multi-input-comparator (MIC), generating 606 a receive sample of the received data signal using a data slicer and the data sampling clock, and generating a plurality of eye characteristic measurements using at least one eye slicer and the variable-phase-offset eye measurement clock, by adjusting a sampling threshold of an eye slicer and a phase offset of the eye-measurement clock.

In some embodiments, at least one eye slicer comprises a first eye slicer having a positive threshold offset, and a second eye slicer having a negative threshold offset. In some embodiments, the data slicer is a DFE-compensated slicer that includes a DFE offset voltage configured to adjust the data slicer threshold to obtain the receive sample.

In some embodiments, the method further includes simultaneously obtaining a data-sampling phase error measurement using a second DFE-compensated slicer having a second DFE offset voltage. In such embodiments, the first and second DFE-compensated slicers may utilize slicing thresholds that are offset with a positive DFE offset and a negative DFE offset, respectively.

In some embodiments, the method includes generating the receive sample using an integrate and hold circuit.

In some embodiments, the method includes generating a data sample and a data phase error signal using the data slicer. In such embodiments, the data phase error signal is processed by a charge pump circuit to generate a local oscillator control signal for the local oscillator.

In some embodiments, the plurality of eye characteristic measurements are used to perform at least one action from the group consisting of: a transmit power adjustment, a receiver gain adjustment, a baud rate adjustment, and a receive equalization adjustment.

In some embodiments, one of the data-sampling clock and the variable-phase-offset eye-measurement clock is generated by the local oscillator, and wherein the other of the data-sampling clock and the variable-phase-offset eye-measurement clock is generated using the phase interpolator. In such embodiments, the data sampling clock and variable-phase-offset eye-measurement clock may be selectively provided to the data slicer and the at least one eye slicer using a selection circuit.

In some embodiments, generating the data-sampling clock includes using the local oscillator, and the variable-phase-offset eye-measurement clock is generated using the adjustable phase interpolator. In alternative embodiments, the data-sampling clock is generated using the adjustable phase interpolator, and the variable-phase-offset eye-measurement clock is generated using the local oscillator.

Figure 4:
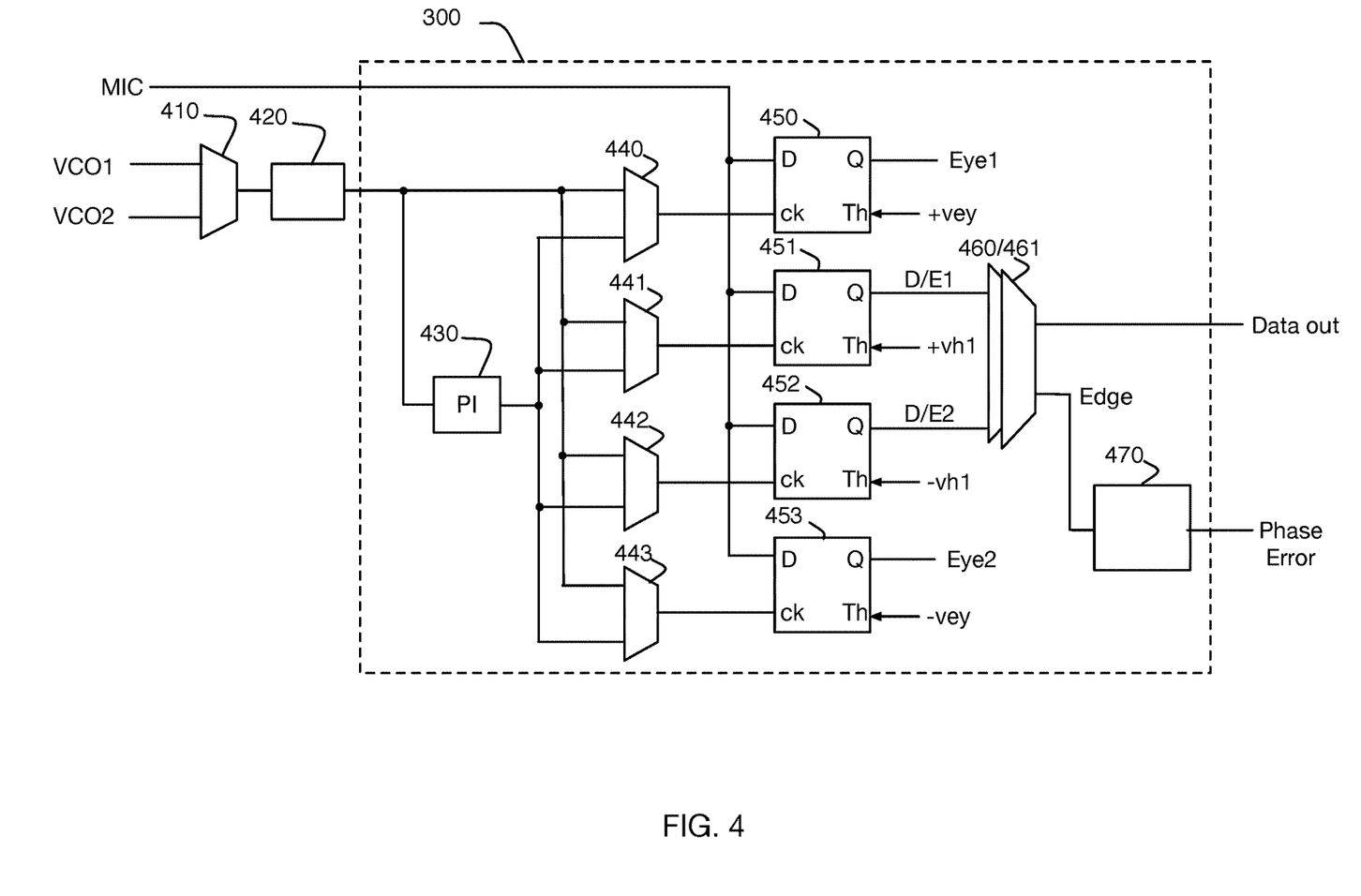
FIG. 4 details one embodiment of a receive processing phase.

FIG. 4 illustrates the above components combined in one embodiment of a processing phase 300, as previously described in relation to FIG. 3. A sampling clock produced by VCO1 or VCO2 may be selected by multiplexer 410, and optionally delayed by adjustable delay buffer 420. The previously-described data sampling function is shown in this embodiment as four clocked samplers (which may also be referred to herein as slicers) 450, 451, 452, 453. In one embodiment, the samplers are clocked analog integrate-and-hold elements, although no limitation is implied as known art sample-and-hold, track-and-hold, clocked comparator, and other comparable circuits are equally applicable.

Each sampler accepts an input signal at D, and compares the state of D relative to threshold Th at the time determined by clock ck with the result available at output Q. Samplers 451 and 452 are provided with speculative DFE correction values +vh1 and −vh1, corresponding to DFE correction values of previous data values "high" and "low" respectively. Thus, as previously described, one of results D/E1 and D/E2 will be chosen by multiplexer 460 as the received data value, with the other result (a potential edge transition) directed by multiplexer 461 to Phase Comparator/Charge Pump 470 to produce a Phase Error signal for adjusting the PLL. Such a phase error signal may correspond to the Early/Late signals shown in FIG. 10.

A comparable multiplexer to that illustrated as 460 selects between signals Eye1 and Eye2 based on the previous received data value, to obtain a measurement result for generation of a statistical eye diagram corresponding to amplitude thresholds +vey, −vey and the timing offset provided by adjustable delay buffer 430. As shown, amplitude thresholds +vey, −vey may be adjusted as the variable-phase-offset clock is rotated throughout the unit interval to determine values for +vey,−vey corresponding to the top and bottom of the eye at various times in the unit interval. Using the determined values for each point in the unit interval, a 2-dimensional diagram of an eye may be generated.

In an alternative embodiment, phase interpolators may be used instead of adjustable delay buffers. Thus, as one example, 430 is a phase interpolator producing a variable-phase-offset clock which may be provided to samplers 450 and 453 for eye measurement. As shown in FIG. 4, multiplexors 441/442 may be configurable to direct the data-sampling clock to data samplers 451/452, while multiplexors 440/443 may be configurable to direct the variable-phase-offset eye-measurement clock to eye samplers 450/453. In some embodiments, the multiplexors 441/442 may direct the selected local oscillator signal to the data samplers 451/452, while conversely the multiplexors 440/443 are configured to direct the output of the phase interpolator 430 to eye samplers 450/453. Alternatively, multiplexors 441/442 may direct the output of phase interpolator 430 to the data samplers 451/452, while conversely the multiplexors 440/443 are configured to direct the selected local oscillator signal to eye samplers 450/453. In some embodiments, phase interpolator 430 may have an associated delay. In such embodiments, the phase interpolator delay may be measured and then accounted for in subsequent operation. In one embodiment, the local oscillator signal may be applied to the data samplers 451/452 and the phase interpolator may adjust the local oscillator signal until the edge of the eye is detected. This provides an interpolator code that represents an offset to the edge of the eye, which, together with the interpolator error is the full offset. Then, the roles of the clock signal may be switched via the multiplexors such that the phase interpolator is rotated until the edge of the eye is detected is by samplers 450/453. Note that as this rotation is occurring, the error signals generated by samplers 451/452 keep the combined local oscillator and phase interpolator output locked to the middle of the eye. The resulting interpolator code may be combined with the first interpolator code to determine the interpolator delay.

As previously described, the received signal MIC is produced by at least one multi-input comparator (MIC) connected to a plurality of wires of a multiwire bus, the MIC configured to form a received data signal. A clock generator PLL, including at least a local oscillator and an adjustable phase interpolator 430 is configured to generate a data-sampling clock and a variable-phase-offset eye-measurement clock. At least one data slicer is configured to receive the data sampling clock, and configured to generate a receive sample of the received data signal, and at least one eye slicer is configured to receive the variable-phase-offset eye-measurement clock, and configured to generate a plurality of eye characteristic measurements. In some embodiments, multiplexors 441 and 442 are configured to provide one of the local oscillator signal VCO1/VCO2 and the signal generated by the phase interpolator 430 to the data slicers 451 and 452, respectively. In such embodiments, multiplexors 440 and 443 may be configured to provide the other of the local oscillator signal and the phase interpolator signal to eye slicers 450 and 453, respectively. In an embodiment utilizing Decision Feedback Equalization (DFE), the eye slicer may include a first eye slicer having a positive threshold offset, and a second eye slicer having a negative threshold offset. Such offsets may be adjusted in order to make eye characteristic measurements to determine a vertical opening of the eye. For example, while the variable-phase-offset eye-measurement clock is rotated forwards and backwards within a given unit interval, threshold offsets ±vey may be adjusted higher and lower to determine the eye height at various locations in the unit interval. Similarly, the data slicer may be a DFE-compensated slicer that includes a DFE offset voltage configured to adjust the data slicer threshold to obtain the receive sample, and may further include a second DFE-compensated slicer having a second DFE offset voltage to simultaneously obtain a data-sampling phase error measurement. In such embodiments, the first and second DFE-compensated slicers may utilize slicing thresholds that are offset with a positive DFE offset and a negative DFE offset, respectively. According to a data history such as data history 1140 shown in FIG. 11, the output of the DFE-compensated slicer utilizing the correct DFE offset may be used as a data sample. Further, the output of the other DFE-compensated slicer may correspond to a phase-error signal, for example if a known pattern was detected using a pattern detector such as pattern detector 1180 shown in FIG. 11.

I claim:

1. A method comprising:
    selecting a local oscillator output as a data-sampling clock for a data sampler and a phase interpolator output as a variable-phase-offset eye-measurement clock for an eye sampler and obtaining a first phase interpolator code that aligns a sampling instant of the eye sampler to an edge of an eye with respect to a data sampling instant of the data sampler;
    selecting the phase interpolator output as the data-sampling clock for the data sampler and the local oscillator output as the variable-phase-offset eye-measurement clock for the eye sampler and obtaining a second phase interpolator code that aligns the sampling instant of the eye sampler to the edge of the eye with respect to the data sampling instant of the data sampler; and
    outputting a phase interpolator delay value by combining the first and second phase interpolator codes.

2. The method of claim 1, wherein an offset from the data sampling instant to the sampling instant of the eye sampler aligned to the edge of the eye corresponds to the phase interpolator delay value added to the first phase interpolator code.

3. The method of claim 1, wherein the data sampling instant is determined by phase-error signals generated by the data sampler according to the data-sampling clock.

4. The method of claim 1, wherein aligning the sampling instant of the eye sampler to the edge of the eye comprises adjusting the local oscillator output responsive to an adjustment to the phase interpolator output.

5. The method of claim 4, wherein the phase interpolator output is adjusted responsive to samples generated according to the local oscillator output.

6. The method of claim 5, wherein the phase interpolator output is re-locked to the data sampling instant according to phase-error signals.

7. The method of claim 1, wherein the phase interpolator output and the local oscillator output are selected as the variable-phase-offset eye-measurement clock via a multiplexer.

8. The method of claim 1, further comprising generating data output signals and phase-error signals at the data sampling instant.

9. The method of claim 8, wherein generating the data output signals and the phase-error signals at the data sampling instant comprises sampling an output of a multi-input comparator (MIC).

10. The method of claim 9, wherein the local oscillator output has a sub-channel specific delay.

11. An apparatus comprising:
    a local oscillator configured to generate a local oscillator output;
    a phase interpolator configured to generate a phase interpolator output based on the local oscillator output, the phase interpolator having a phase interpolator delay value determined from first and second phase interpolator codes;
    a selection circuit configured to:
        select the local oscillator output as a data-sampling clock for a data sampler and the phase interpolator output as a variable-phase-offset eye-measurement clock for an eye sampler to obtain the first phase interpolator code that aligns a sampling instant of the eye sampler to an edge of an eye with respect to a data sampling instant of the data sampler; and
        select the phase interpolator output as the data-sampling clock for the data sampler and the local oscillator output as the variable-phase-offset eye-measurement clock for the eye sampler to obtain the second phase interpolator code that aligns the sampling instant of the eye sampler to the edge of the eye with respect to the data sampling instant of the data sampler.

12. The apparatus of claim 11, wherein an offset from the data sampling instant of the data sampler to the sampling instant of the eye sampler aligned to the edge of the eye corresponds to the phase interpolator delay value added to the first phase interpolator code.

13. The apparatus of claim 11, wherein the data sampling instant of the data sampler is determined by phase-error signals generated by the data sampler according to the data-sampling clock.

14. The apparatus of claim 11, wherein the local oscillator is configured to adjust the local oscillator output responsive to an adjustment to the phase interpolator output to align the sampling instant of the eye sampler to the edge of the eye.

15. The apparatus of claim 14, wherein the phase interpolator is configured to adjust the phase interpolator output responsive to samples generated according to the local oscillator output.

16. The apparatus of claim 15, wherein the phase interpolator output is re-locked to the data sampling instant according to phase-error signals generated according to the phase-interpolator output.

17. The apparatus of claim 11, wherein the selection circuit comprises a multiplexer.

18. The apparatus of claim 11, wherein the data sampler is configured to generate data output signals and phase-error signals at the data sampling instant.

19. The apparatus of claim 18, wherein the data sampler is configured to sample an output of a multi-input comparator (MIC) to generate the data output signals and the phase-error signals.

20. The apparatus of claim 19, further comprising a tunable delay element configured to apply a sub-channel specific delay to the local oscillator output.

* * * * *